(12) United States Patent
Visocchi et al.

(10) Patent No.: US 6,198,356 B1
(45) Date of Patent: Mar. 6, 2001

(54) VOLTAGE CONTROLLED OSCILLATOR POWER SUPPLY AND TEMPERATURE COMPENSATION CIRCUIT

(75) Inventors: Pasqualino Visocchi, Enfield (GB); Robert James Forbes, Ottawa (CA)

(73) Assignee: Nortel Networks Limited, Montreal (CA)

( * ) Notice: Subject to any disclaimer, the term of this patent is extended or adjusted under 35 U.S.C. 154(b) by 0 days.

(21) Appl. No.: 09/352,167

(22) Filed: Jul. 12, 1999

(51) Int. Cl.[7] .............................. H03B 5/24; H03L 7/099; H03K 5/14

(52) U.S. Cl. .............................. 331/34; 331/57; 331/175; 331/176; 331/177 R; 331/179; 327/158; 327/280; 327/281; 375/376

(58) Field of Search .............................. 331/34, 57, 175, 331/176, 177 R, 179; 327/156–159, 274, 280, 281, 287, 288; 375/376

(56) References Cited

U.S. PATENT DOCUMENTS 5,349,311 * 9/1994 Mentzer .............................. 331/57

* cited by examiner

Primary Examiner—David Mis
(74) Attorney, Agent, or Firm—Lee, Mann, Smith, McWilliams, Sweeney & Ohlson

(57) ABSTRACT

Circuits such as Phase Lock Loops which use VCO's are affected by temperature and power supply variations which effect the performance of the circuit, particularly at high frequencies and low supply voltages. The present invention provides a variable delay circuit stage comprising one or more delay stages and an analogue multiplexer arranged to control the amount of delay introduced by the delay stages; a supply voltage pushing compensation circuit stage comprising a transconductance stage connected to the multiplexer and arranged to produce a compensating current upon deviation from nominal supply voltage which changes said delay; and a temperature pushing compensation circuit stage comprising a transconductance stage connected to the multiplexer and arranged to produce a compensating current upon deviation from nominal temperature which changes said delay.

8 Claims, 6 Drawing Sheets

VOLTAGE CONTROLLED OSCILLATOR POWER SUPPLY AND TEMPERATURE COMPENSATION CIRCUIT

FIELD OF THE INVENTION

The present invention relates to power supply and temperature compensation circuits for voltage controlled oscillators for example.

BACKGROUND OF THE INVENTION

Voltage controlled oscillators (VCO) are used in a number of circuits including phase lock loops (PLL) for example, which in turn can be used in radio tuning, multiplexer synthesisers, or clock extraction in optical fibre receivers for timing reference for example. To ensure low cost and minimal component count, the VCO is preferably realised as a fully integrated design of the PLL. However the demands of PLL performance such as low jitter, low power supply pushing, and high temperature stability often force PLL designers to use a more costly external voltage controlled crystal oscillator, making the PLL, more difficult and costly to manufacture.

Many electronic components now operate at reduced supply voltages, for example 3V, which makes them more susceptible to supply and temperature pushing. Current integrated VCO which compensate for such temperature and power supply variations have met with limited success and are discussed in more detail below.

OBJECT OF THE INVENTION

It is an object of the present invention to provide an improved temperature and power supply compensation method for VCO.

It is a further object of the present invention to provide an improved VCO.

SUMMARY OF THE INVENTION

In a first aspect the present invention provides a supply voltage pushing compensation circuit stage for use with a variable delay circuit stage comprising one or more delay stages and an analogue multiplexer arranged to control the amount of delay introduced by the delay stages; the compensation circuit comprising a transconductance stage connected to the multiplexer and arranged to produce a compensating current upon deviation from nominal supply voltage which changes said delay.

Preferably the transconductance stage comprises a first transistor having a base voltage provided by a constant current source and a second transistor having a base voltage provided by a voltage divider such that deviation from nominal supply voltage produces a voltage difference between said first and second transistor to produce said compensating current.

In a second aspect the present invention provides a temperature pushing compensation circuit stage for use with a variable delay circuit stage comprising one or more delay stages and an analogue multiplexer arranged to control the amount of delay introduced by the delay stages; the compensation circuit comprising a transconductance stage connected to the multiplexer and arranged to produce a compensating current upon deviation from nominal temperature which changes said delay.

Preferably the transconductance stage comprises a first transistor having a base voltage provided by a constant current source and a second transistor having a base voltage provided by a temperature dependent voltage divider such that deviation from nominal supply voltage produces a voltage difference between said first and second transistor to produce said compensating current.

In a third aspect the present invention provides a variable delay circuit stage comprising one or more delay stages and an analogue multiplexer arranged to control the amount of delay introduced by the delay stages; a supply voltage pushing compensation circuit stage comprising a transconductance stage connected to the multiplexer and arranged to produce a compensating current upon deviation from nominal supply voltage which changes said delay; and a temperature pushing compensation circuit stage comprising a transconductance stage connected to the multiplexer and arranged to produce a compensating current upon deviation from nominal temperature which changes said delay.

In a fourth aspect the present invention provides a voltage controlled oscillator comprising one or more variable delay circuit stages each comprising one or more delay stages and an analogue multiplexer arranged to control the amount of delay introduced by the delay stages; a supply voltage pushing compensation circuit stage comprising a transconductance stage connected to the multiplexer and arranged to produce a compensating current upon deviation from nominal supply voltage which changes said delay; and a temperature pushing compensation circuit stage comprising a transconductance stage connected to the multiplexer and arranged to produce a compensating current upon deviation from nominal temperature which changes said delay.

In a fifth aspect the present invention provides a Phase Lock Loop comprising a voltage controlled oscillator comprising one or more variable delay circuit stages each comprising one or more delay stages and an analogue multiplexer arranged to control the amount of delay introduced by the delay stages; a supply voltage pushing compensation circuit stage comprising a transconductance stage connected to the multiplexer and arranged to produce a compensating current upon deviation from nominal supply voltage which changes said delay; and a temperature pushing compensation circuit stage comprising a transconductance stage connected to the multiplexer and arranged to produce a compensating current upon deviation from nominal temperature which changes said delay.

In a sixth aspect the present invention provides a clock and data recovery circuit arrangement comprising a Phase Lock Loop comprising a voltage controlled oscillator comprising one or more variable delay circuit stages each comprising one or more delay stages and an analogue multiplexer arranged to control the amount of delay introduced by the delay stages; a supply voltage pushing compensation circuit stage comprising a transconductance stage connected to the multiplexer and arranged to produce a compensating current upon deviation from nominal supply voltage which changes said delay; and a temperature pushing compensation circuit stage comprising a transconductance stage connected to the multiplexer and arranged to produce a compensating current upon deviation from nominal temperature which changes said delay.

BRIEF DESCRIPTION OF THE DRAWINGS

In order to show how the invention may be carried into effect, embodiments of the invention are now described below by way of example only and with reference to the accompanying figures in which.

DETAILED DESCRIPTION OF THE INVENTION

Figure 1:
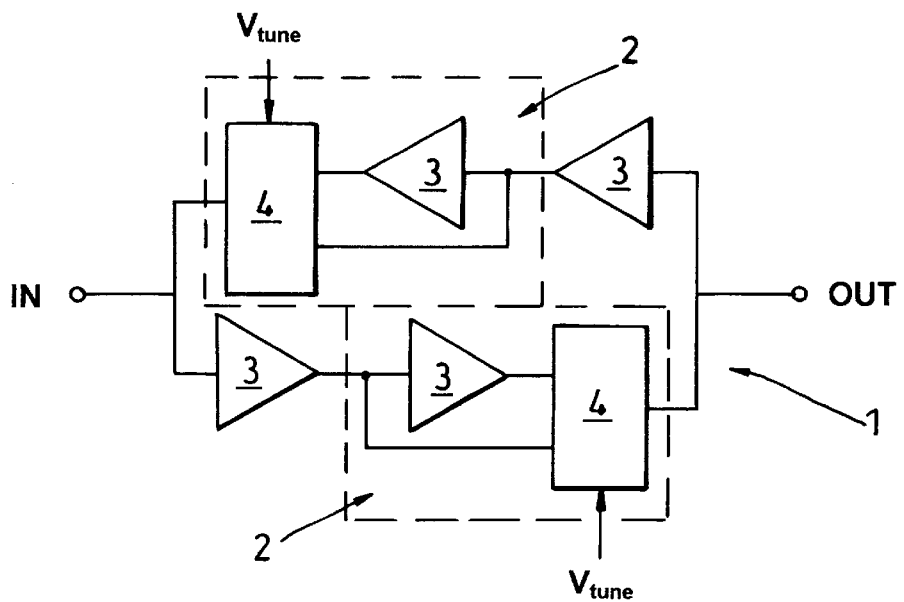
FIG. 1 shows a known ring VCO.

A block diagram of a typical ring VCO for a PLL is shown in FIG. 1. The VCO 1 comprises two variable delay circuits or stages 2 connected in a ring configuration as shown, where each variable delay stage 2 comprises a delay stage 3 and an analogue multiplexer 4 connected as shown. To control the frequency of oscillations, the number of delay stages 3 connected in the ring is effectively varied by the multiplexers 4 which partly or fully short-circuit the delay stages 3 dependent on $V_{tune}$.

The VCO 1 is typically implemented within a PLL (not shown) as is well know in the art. The PLL acts to lock its output signal to an input signal for use in data and clock recovery circuits for example. However variations in the VCO power supply and/or component temperatures can effect its frequency of oscillation which in turn effects the performance of the PLL.

Figure 2:
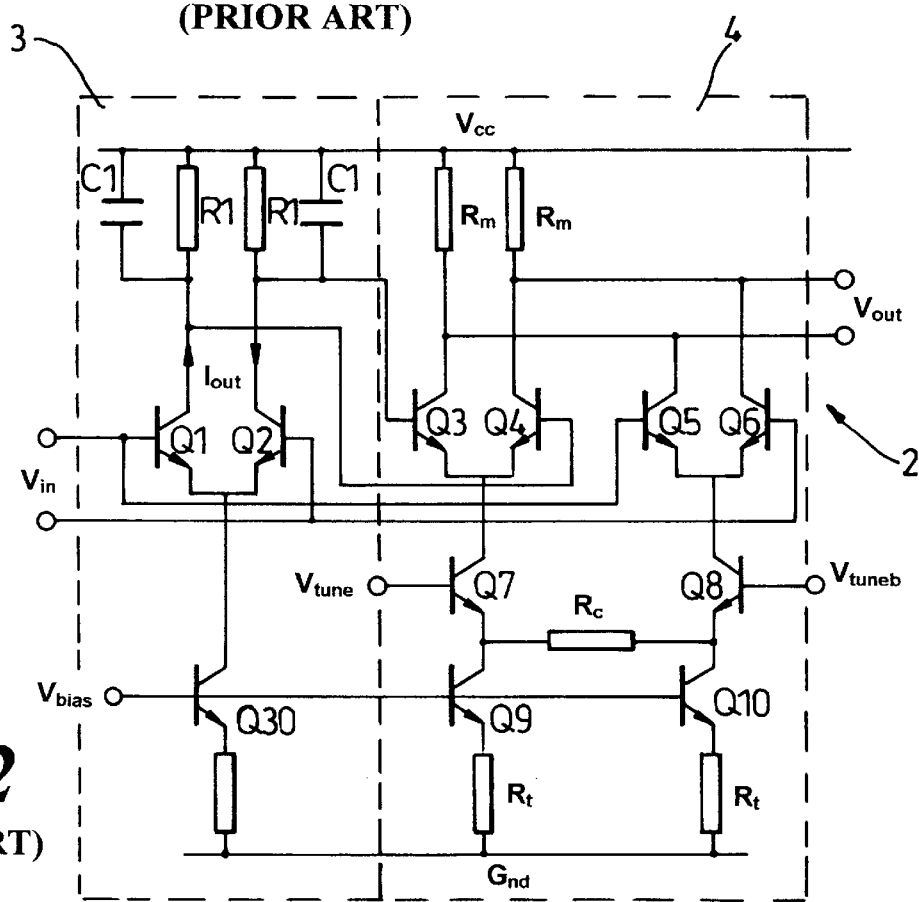
FIG. 2 shows a component level circuit realisation for a variable delay stage of the VCO of FIG. 1.

A typical component level circuit realisation of a variable delay stage 2 is shown in FIG. 2. A delay stage 3 of the variable delay stage 2 formed by transistors Q1 and Q2 is a standard delay cell formed of a long tail pair. The incoming propagating signal $V_{in}$, is applied to the bases of the switching transistors Q1 and Q2 forming a transconductance stage in the delay stage 3. This transconductor stage converts the voltage signal input into a current output, which is applied to the load device formed by collector resistors R1.

The load capacitance C1 may be fabricated components or simply the input capacitance of the following stage. The result of the output current flowing into an RC load delays the propagating signal to the following stage.

The output voltage from the delay stage 3 is connected to the bases of transistors Q3 and Q4 which forms a first input to the analogue multiplexer stage 4. The voltage input connected to the delay stage 3 is also connected to the second input of the multiplexer 4 formed by transistors Q5 and Q6. The current output of the transconductance stage (Q3, Q4, Q5 and Q6) of the multiplexer 4 is connected to a load resistance $R_m$ to provide a voltage output to the next stage.

If a maximum delay is required to reduce the frequency of oscillation, the $V_{tune}$ input is biased to ensure that the total (or the majority) of the tail current formed by transistors Q9, Q10, resistance $R_l$ and $V_{bias}$ of the multiplexer 4 flows in the collector of Q7. This allows the input signal $V_{in}$ to flow through the delay stage 3 to the output of the multiplexer 4 providing maximum delay. However, if the minimum delay is required to increase the frequency of oscillation, then the $V_{tune}$ input is biased to ensure that the total (or the majority) of the tail current of the multiplexer 4 flows through the collector of transistor 08, providing the input signal $V_{in}$ a more direct path with minimum delay to the following stage. The gain of the multiplexer 4 and thus the gain of the VCO is determined by the degenerating resistance $R_e$, the lower the value the higher the gain.

The effect of the power supply and temperature variations on the variable gain stage 2 is to alter the delay and hence the frequency of the VCO resulting in increased jitter. In the case of power supply pushing, the amount of delay in each delay stage 3 is reduced as a result of increased rail (Vcc) voltage. Small changes in the base-collector capacitance and finite output conductance changes in Q11 cause current distribution of the delay stage transistors Q1 and Q2 which alters the delay of the stage. In addition, temperature variation on transistor characteristics also varies the current distribution in the multiplexer stage resulting in temperature pushing.

Figure 3:
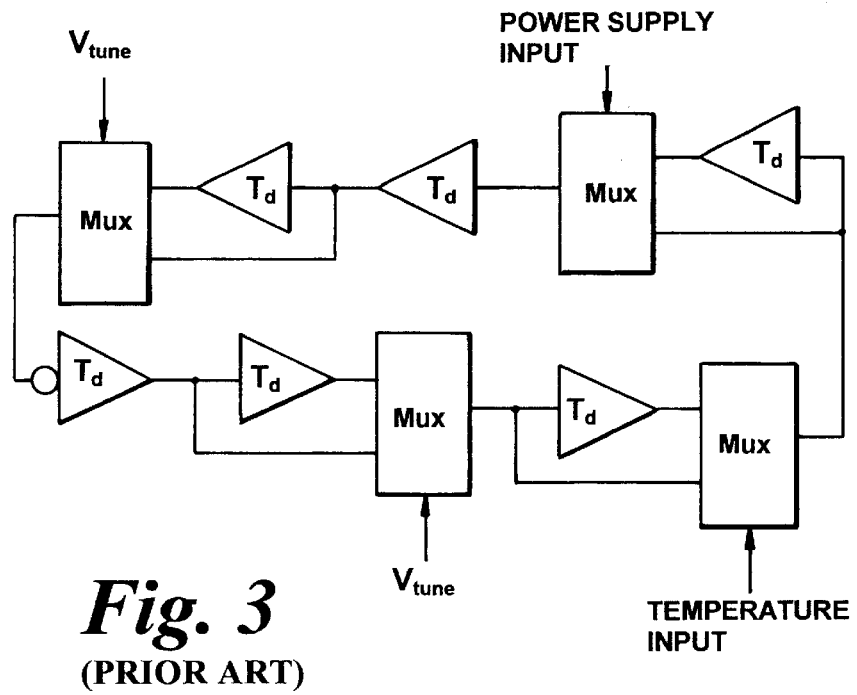
FIG. 3 shows a prior art power supply and temperature variation compensation arrangement for the ring VCO of FIG. 1.

These effects on the whole push frequency in a monatomic manner which may be compensated for by adding additional delay stages 3 within the ring VCO as is known and shown in FIG. 3. The additional variable delay stages 2 are used to increase or reduce the delay of the ring VCO 1 produced by power supply or temperature variations, compensating for this pushing. However, this technique suffers from reducing the maximum frequency of operation that the VCO can achieve, since additional delay stages have been included into the ring. The VCO gain is also no longer determined by the variable delay stages 2 resulting in varying PLL parameters.

Figure 4:
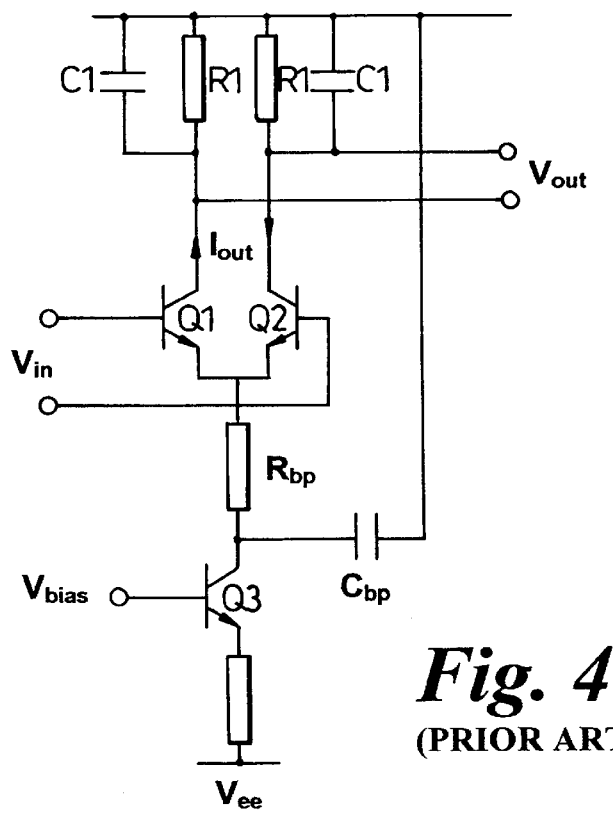
FIG. 4 shows a further prior art power supply compensation arrangement for a delay cell of the VCO of FIG. 1.

FIG. 4 shows a known circuit arrangement used to reduce the above problems. The delay stages 3 are modified by the addition of bypass resistor $R_{bp}$ and capacitor $C_{bp}$. These bypass structures couple samples of the power supply noise to the internal bias circuit formed by transistor Q3 and $V_{bias}$. While the impedance of the current source is very high, the emitters of transistors Q1 and Q2 track power supply variations, the displacement current through the collector-base capacitance of transistor Q3 lowers the impedance and the displacement current flows into the emitters of transistors Q1 and Q2, thus modifying the delay. The introduction of the bypass capacitance supplies the displacement current demanded by the collector-base capacitance of transistor Q3, and the series resistance $R_{bp}$ maintains a high impedance of the current source. However this technique is only effective at relatively high power supply ripple frequencies (greater than 1 MHz), determined by the size of the on-chip capacitor ($C_{bp}$), which becomes the limiting factor.

Figure 5:
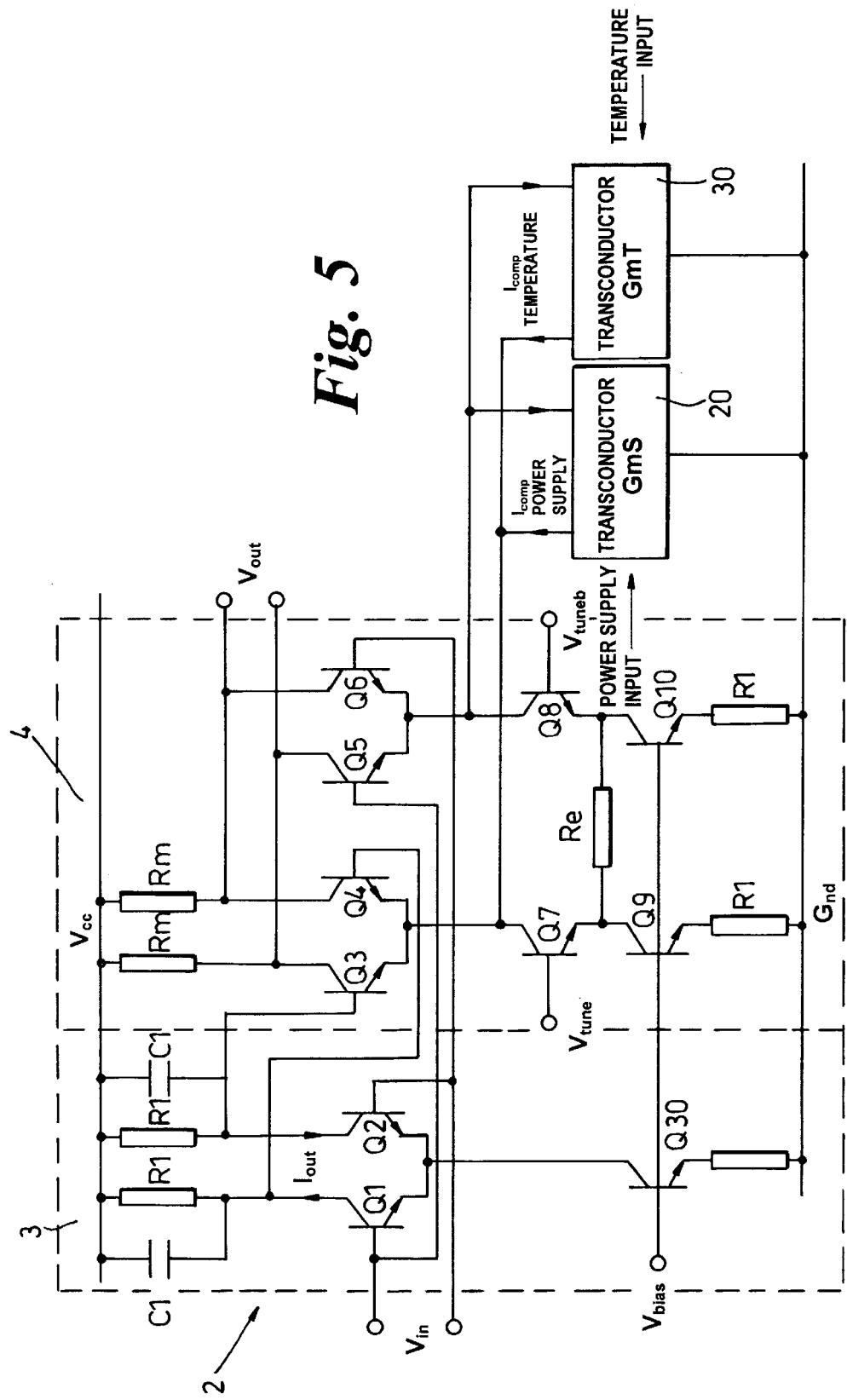
FIG. 5 shows a power supply and temperature compensation arrangement of the invention.

FIG. 5 shows a variable delay stage 2 modified according to the invention with a direct coupled power supply pushing compensation stage 20 and a direct coupled temperature pushing compensation stage 30. These additional transconductance amplifier stages 20 and 30 are connected in parallel with the main multiplexer transconductance amplifier stage. The delay for the ring VCO 1 is determined by $V_{tune}$ and is set at a nominal power supply and temperature, while the gain KO of the VCO is determined by Re. As the power supply varies, the emitters of Q1 and Q2 which form part of the fixed delay stage 3 track the power supply variation, the displacement current through the collector-base capacitance of Q30 lowers the impedance and a displacement current flows into the emitters of Q1 and Q2, altering the delay of the fixed delay stage 3. However, the amount of power supply variation is also applied to the input of the transconductance stage 20, connected in parallel with the main multiplexer transconductance stage 4, which in turn alters the distribution of current through transistors Q3, Q4 and Q5; Q6 of the multiplexer transistors altering the delay of vin to vout. By choosing the appropriate gain, GmS, of the power supply pushing compensation stage 20, the delay caused by power supply pushing can be effectively compensated for down to DC changes in voltage.

As the temperature varies, the current sources formed by transistors Q30, Q9 and Q10 remain constant to maintain correct offset voltages. However the HFE and Ft of transistors vary with temperature altering the delay of the fixed delay stage 3. To counter this effect, a temperature dependent voltage is applied to the input of the transconductance stage 30, connected in parallel with the main multiplexer transconductance stage 4, this in turn alters the distribution of current through transistors Q3, Q4 and Q5, Q6 of the multiplexer transistors altering the delay of vin to vout. By choosing the appropriate gain, GmT, of the temperature pushing compensation stage 30, the delay caused by temperature pushing is effectively compensated for.

Figure 6:
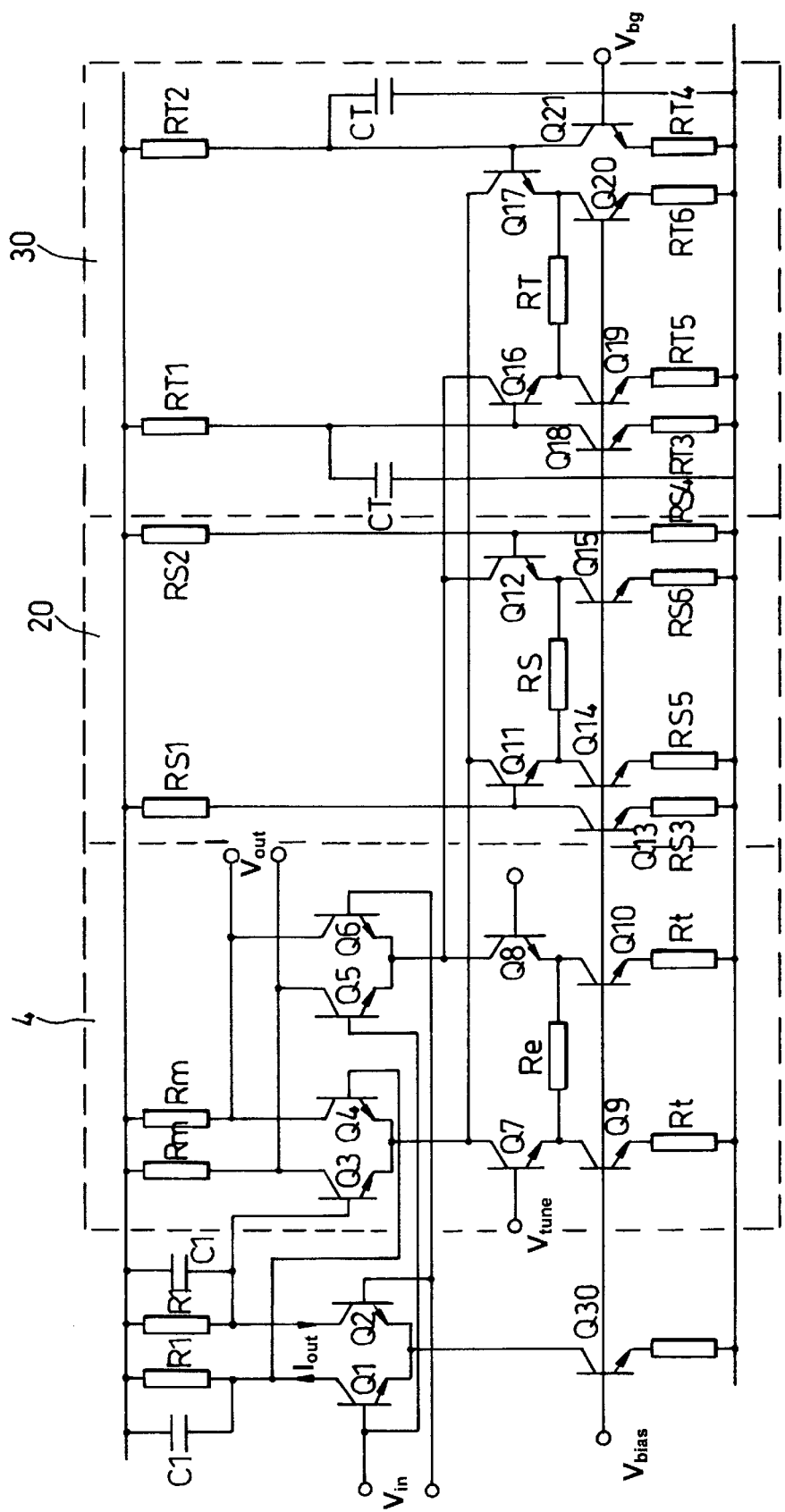
FIG. 6 shows a first embodiment component level circuit realisation of the arrangement of FIG. 5.

FIG. 6 shows a preferred component level circuit arrangement for the power supply and temperature compensation circuit stages 20 and 30. In the power supply compensation stage 20, a transconductance stage is formed by transistors Q11 and Q12, the gain being set by RS. The constant current sources are provided by transistors Q13, Q14 and Q15, and resistors RS3, RS5 and RS6, biased by voltage source $V_{bias}$. The constant current provided by Q13 and RS3 sets a constant voltage at the base of Q11 via RS1, while a simple potential divider formed by RS2 and RS4 provides the same voltage at the base of Q12 at nominal supply voltage. If the supply voltage alters (i.e. ripples) the voltage at the base of Q11 will track the supply voltage, while the voltage at the base of Q12 which is provided by a simple potential divider would only track a proportion of the supply voltage, resulting in a potential difference between the bases of Q11 and Q12. This potential difference between the transconductor input results in a compensating current, determined by the gain RS to adjust the delay of the multiplexer, maintaining a constant delay set by $V_{tune}$.

For example, if the power supply, VCC was to increase, the voltage at the base of transistor Q11 would be larger than the voltage at the base of transistor Q12, resulting in an increase in current in the collector of Q11 and a decrease in collector current in Q12. This in turn provides more current at the emitters of Q3 and Q4 transistors and less current in the emitters of Q5 and Q6 transistors of the multiplexer stage 4, resulting in increasing amount of delayed signal through delay stage 3 flowing to the multiplexer output. This would have the effect of compensating for the reduction in delay caused by the increase supply voltage.

Referring again to FIG. 6 a preferred component level circuit arrangement for the temperature compensation circuit stage 30 is shown. A transconductance stage is formed by transistors Q16 and Q17 and the gain set by RT. The constant current sources are provided by transistors Q18, Q19, Q20, Q21 and resistors RT3, RT5, RT6 and RT4, biased by a voltage source $V_{bias}$ and $V_{bg}$. The constant current provided by Q18 and RT3 sets a constant voltage at the base of Q16 via RT1, while the voltage at the base of Q17 is provided by a PTAT (proportional to absolute temperature) current source via RT2 to give the same voltage at the base of Q17 at nominal temperature. As the temperature varies from nominal, a potential difference between Q16 and Q17 appears resulting in a compensating current determined by the gain RT to adjust the delay of the multiplexer, maintaining a constant delay set by $V_{tune}$.

For example, if the junction temperature were to increase, the voltage at the base of transistor Q16 would be larger than the voltage at the base of transistor Q17, resulting in an increase in current in the collector of Q16 and a decrease in collector current in Q17. This in turn provides more current at the emitters of Q5 and Q6 transistors and less current in the emitters of Q3 and Q4 transistors of the multiplexer stage 4, resulting in reducing the amount of delayed signed through delay stage 3 flowing to the multiplexer output. This would have the effect of compensating for the increase in delay caused by the increase in junction temperature.

Since thermal effects are relatively slow compared to power supply ripple for example, the bases of transistors Q16 and Q17 may be decoupled by a capacitor CT, reducing any thermal induced jitter contribution from the resistors RT1 and RT2.

Since the voltage supply to the bases Q16 and Q17 are from current sources, the temperature compensating transconductor is not effected by power supply pushing, thus the power supply compensation and temperature compensation transconductor circuit stages 20 and 30 are effectively decoupled from each other. In practice, with the introduction of the parallel, direct coupled compensation circuit stages 20 and 30, the supply pushing has been reduced from 40 MHz/V to 3.5 MHz/V; and the temperature pushing has been reduced from 10 MHz/° C. to 20 KHz/° C. under nominal process conditions.

Figure 7:
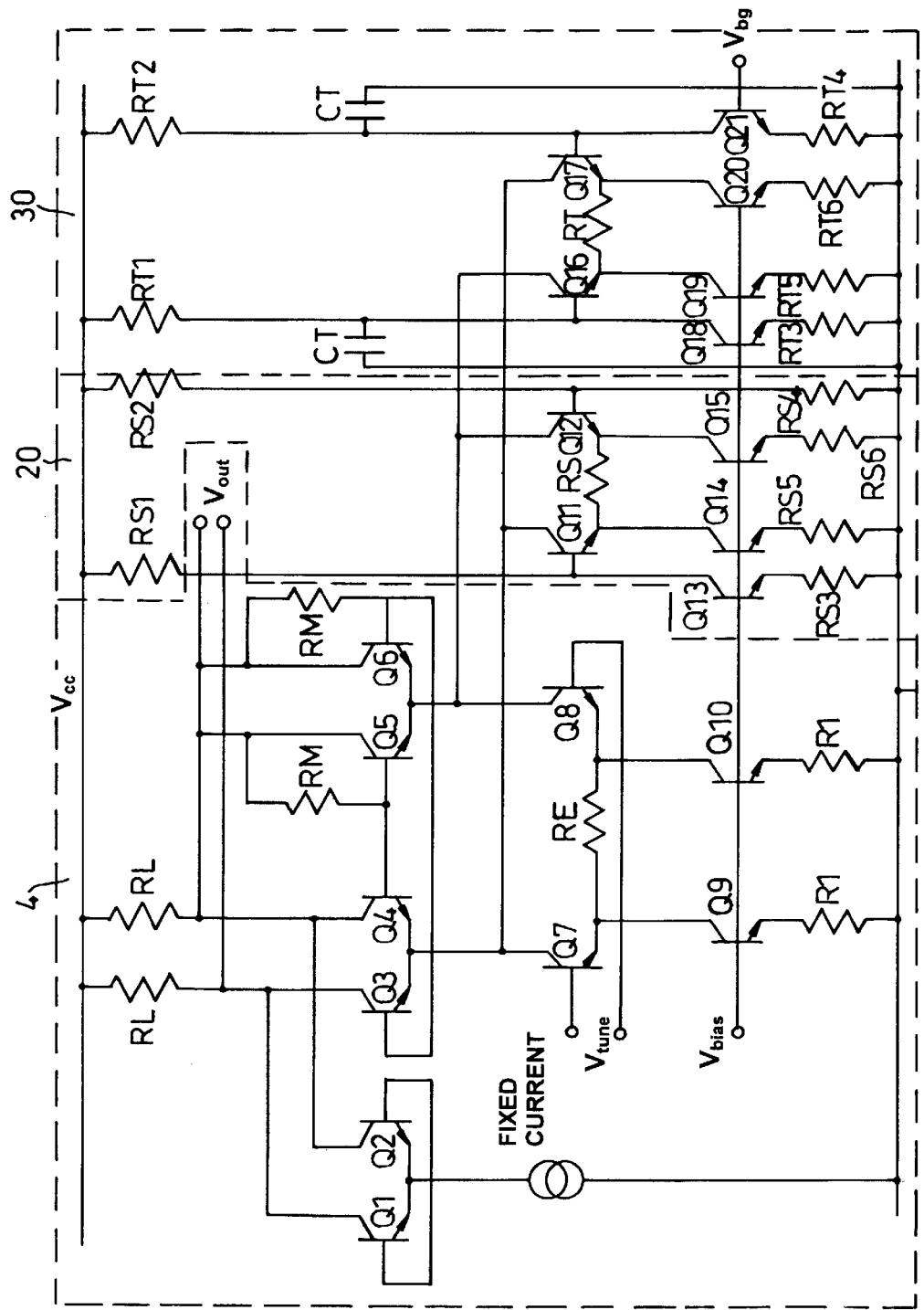
FIG. 7 shows a second embodiment component level circuit realisation of the arrangement of FIG. 5.

FIG. 7 shows an alternative variable delay stage 4, incorporating the supply and temperature compensating circuit stages 20 and 30. In the delay stage 4 of FIG. 6, the minimum delay is not zero but a finite amount due to a circuit path through transistors. The alternative variable delay stage 4 of FIG. 7 is arranged to reduce this minimum delay, and hence increase the possible frequency of oscillation of the PLL over that possible with the FIG. 2 or 6 design. As opposed to the standard design of FIG. 2, where the fixed delay stage is connected in cascade with the multiplexer stage, the alternative design of FIG. 7 effectively incorporates the fixed delay stage in parallel with the multiplexer stage which uses a method of positive and negative feedback. This circuit is described in Ansgar Pottbacker and Ulrich Langmann: "An 8 GHz Silicon Bipolar Clock-Recovery and Data-Regenerator IC", IEEE J. Solid-Stade Circuits, vol. 29, pp1572–1576, December 1994. The power supply and temperature compensating stages however are connected in exactly the same position as in the standard design of FIG. 6, operating in the same manner with the same effect. The alternative arrangement of FIG. 7 allows the frequency of oscillation to be increased, however the arrangement of FIG. 6 is preferred for moderate or lower frequencies.

Figure 8:
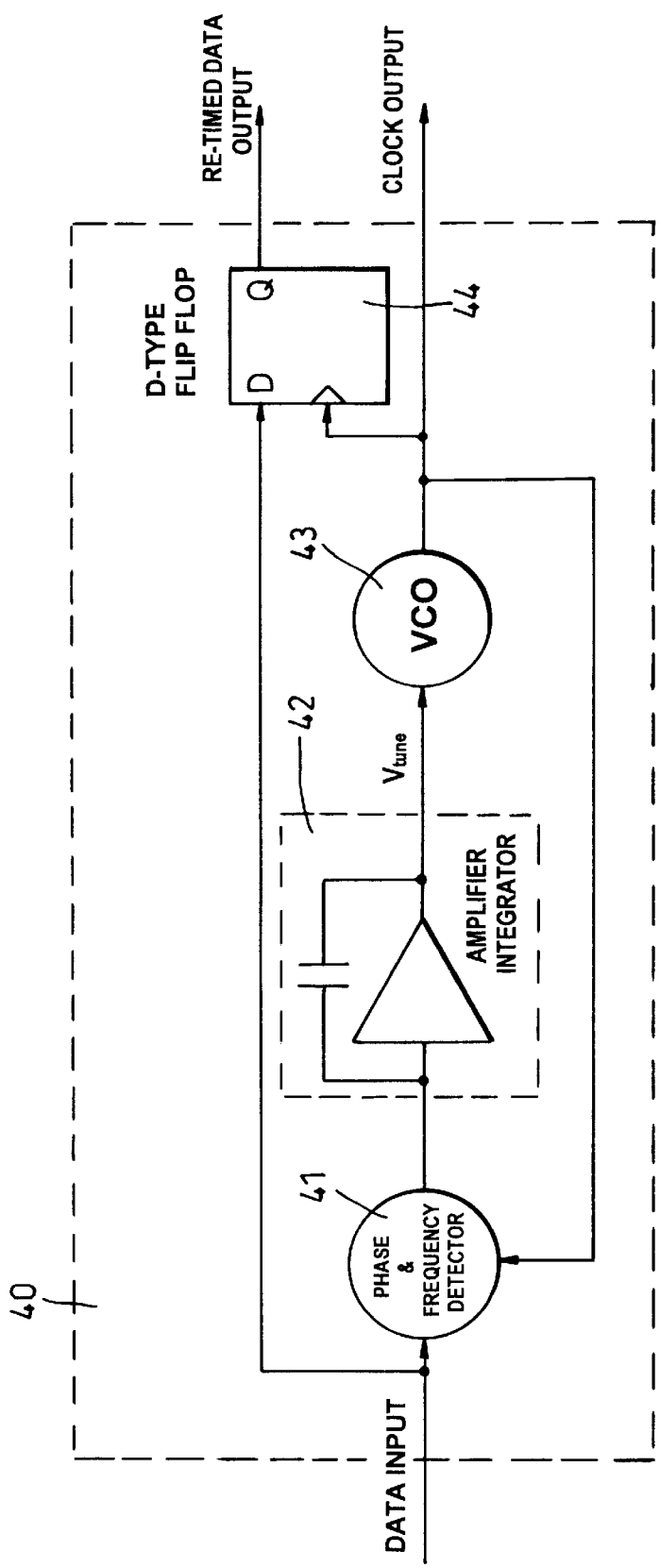
FIG. 8 shows application of a power supply and temperature compensated VCO in a data and clock recovery circuit.

FIG. 8 shows a PLL arranged according to the invention incorporated into a clock recovery and data re-timing chip 40 for use in an optical receiver. The chip 40 comprises a phase and frequency detector circuit 41, connected in series with an amplifier configured as an integrator 42, whose output is connected to $V_{tune}$ of the VCO 43. The clock output of the VCO 43, is connected to the phase and frequency detector circuit 41, to form a negative feedback loop. In addition, the clock output of the VCO is also applied to the clock input of the D-Type flip-flop 44. The data input stream is also applied to the D-Type flip-flop and the r-timed data output is provided from the Q output of the flip-flop.

The foregoing describes the invention including preferred forms thereof. Alterations and modifications as would be obvious to some one skilled in the art are intended to be incorporated within the scope hereof.

We claim:

1. A supply voltage pushing compensation circuit stage for use with a variable delay circuit stage comprising one or more delay stages and an analogue multiplexer arranged to control the amount of delay introduced by the delay stages; the compensation circuit comprising:

a transconductance stage connected to the multiplexer and arranged to produce a compensating current upon deviation from nominal supply voltage which changes said delay.

2. A circuit stage as claimed in claim 1, wherein the transconductance stage comprises a first transistor having a base voltage provided by a constant current source and a second transistor having a base voltage provided by a voltage divider such that deviation from nominal supply voltage produces a voltage difference between said first and second transistor to produce said compensating current.

3. A temperature pushing compensation circuit stage for use with a variable delay circuit stage comprising one or more delay stages and an analogue multiplexer arranged to control the amount of delay introduced by the delay stages; the compensation circuit comprising:

a transconductance stage connected to the multiplexer and arranged to produce a compensating current upon deviation from nominal temperature which changes said delay.

4. A circuit stage as claimed in claim 3, wherein the transconductance stage comprises a first transistor having a base voltage provided by a constant current source and a second transistor having a base voltage provided by a temperature dependent voltage divider such that deviation from nominal supply voltage produces a voltage difference between said first and second transistor to produce said compensating current.

5. A variable delay circuit stage comprising:

one or more delay stages and an analogue multiplexer arranged to control the amount of delay introduced by the delay stages;

a supply voltage pushing compensation circuit stage comprising a transconductance stage connected to the multiplexer and arranged to produce a compensating current upon deviation from nominal supply voltage which changes said delay; and a temperature pushing compensation circuit stage comprising a transconductance stage connected to the multiplexer and arranged to produce a compensating current upon deviation from nominal temperature which changes said delay.

6. A voltage controlled oscillator comprising one or more variable delay circuit stages each comprising:

one or more delay stages and an analogue multiplexer arranged to control the amount of delay introduced by the delay stages;

a supply voltage pushing compensation circuit stage comprising a transconductance stage connected to the multiplexer and arranged to produce a compensating current upon deviation from nominal supply voltage which changes said delay; and a temperature pushing compensation circuit stage comprising a transconductance stage connected to the multiplexer and arranged to produce a compensating current upon deviation from nominal temperature which changes said delay.

7. A Phase Lock Loop comprising a voltage controlled oscillator comprising one or more variable delay circuit stages each comprising:

one or more delay stages and an analogue multiplexer arranged to control the amount of delay introduced by the delay stages;

a supply voltage pushing compensation circuit stage comprising a transconductance stage connected to the multiplexer and arranged to produce a compensating current upon deviation from nominal supply voltage which changes said delay; and a temperature pushing compensation circuit stage comprising a transconductance stage connected to the multiplexer and arranged to produce a compensating current upon deviation from nominal temperature which changes said delay.

8. A clock and data recovery circuit arrangement comprising a Phase Lock Loop comprising a voltage controlled oscillator comprising one or more variable delay circuit stages each comprising:

one or more delay stages and an analogue multiplexer arranged to control the amount of delay introduced by the delay stages;

a supply voltage pushing compensation circuit stage comprising a transconductance stage connected to the multiplexer and arranged to produce a compensating current upon deviation from nominal supply voltage which changes said delay; and a temperature pushing compensation circuit stage comprising a transconductance stage connected to the multiplexer and arranged to produce a compensating current upon deviation from nominal temperature which changes said delay.

* * * * *